United States Patent
Durocher et al.

(10) Patent No.: US 7,158,383 B2
(45) Date of Patent: Jan. 2, 2007

(54) TECHNIQUES FOR FABRICATING A RESISTOR ON A FLEXIBLE BASE MATERIAL

(75) Inventors: Kevin M. Durocher, Waterford, NY (US); Richard J. Saia, Niskayuna, NY (US); Vikram B. Krishnamurthy, Atlanta, GA (US)

(73) Assignee: General Electric Company, Niskayuna, NY (US)

( * ) Notice: Subject to any disclaimer, the term of this patent is extended or adjusted under 35 U.S.C. 154(b) by 256 days.

(21) Appl. No.: 10/716,143

(22) Filed: Nov. 18, 2003

(65) Prior Publication Data

US 2004/0114336 A1    Jun. 17, 2004

Related U.S. Application Data

(63) Continuation of application No. 10/261,052, filed on Sep. 30, 2002, now Pat. No. 6,709,944.

(51) Int. Cl.
*H05K 1/16*    (2006.01)

(52) U.S. Cl. ............... 361/749; 361/750; 361/751; 361/783; 174/254; 174/256; 174/257; 174/258; 174/260; 338/310; 257/99

(58) Field of Classification Search .............. None
See application file for complete search history.

(56) References Cited

U.S. PATENT DOCUMENTS 4,485,297 A * 11/1984 Grise et al. ............ 219/528
5,065,502 A * 11/1991 Amante ................. 29/620
5,250,388 A    10/1993 Schoch et al. .......... 430/269
5,340,640 A *  8/1994 Bientz ................... 428/206
5,753,523 A     5/1998 Giedd et al. ............ 438/610
6,932,518 B1 *  8/2005 Greenlaw ............... 385/88
6,936,855 B1 *  8/2005 Harrah .................. 257/88
2003/0079910 A1 *  5/2003 Kosowsky ............... 174/260

FOREIGN PATENT DOCUMENTS

JP      05347434 A  * 12/1993

\* cited by examiner

*Primary Examiner*—John B. Vigushin
(74) *Attorney, Agent, or Firm*—Fletcher Yoder

(57) ABSTRACT

A technique for fabricating a resistor on a flexible substrate. Specifically, at least a portion of a polyimide substrate is activated by exposure to a ion sputter etch techniques. A metal layer is disposed over the activated portion of the substrate, thereby resulting in the formation of a highly resistive metal-carbide region. Interconnect layers are disposed over the metal-carbide region and patterned to form terminals at opposite ends of the metal carbide region. The metal-carbide region is patterned to form a resistor between the terminals. Alternatively, only a selected area of the polyimide substrate is activated. The selected area forms the area in which the metal-carbide region is formed. Interconnect layers are disposed over the metal-carbide region and patterned to form terminals at opposite ends of the metal-carbide region.

21 Claims, 7 Drawing Sheets

TECHNIQUES FOR FABRICATING A RESISTOR ON A FLEXIBLE BASE MATERIAL

This application is a Continuation of application Ser. No. 10/261,052, filed Sep. 30, 2002 now U.S. Pat. No. 6,709,944.

BACKGROUND OF THE INVENTION

This invention relates generally to resistor fabrication and, more specifically, to highly resistive structures formed on a flexible base material and techniques for fabricating such a structure.

A number of commercial applications implement semiconductor devices which may be susceptible to electrostatic discharge. One such device is a semiconductor light emitting diode (LED). LEDs are semiconductor chips that are packaged to emit radiation in response to an applied voltage or current. These LEDs are used in a number of commercial applications such as automotive, display, safety/emergency and directed area lighting. LEDs may be fabricated using any materials which emit visible, ultra-violet or infrared radiation. Thus, LED devices may comprise materials having a p-n junction of semiconductor layers capable of emitting the desired radiation. For example, the LED devices may be fabricated using any desirable III–V semiconductor compound layer, such as GaAs, GaAlAs, GaN, InGaN, GaP, etc., II–VI semiconductor compound layers, such as ZnSe, ZnSSe, CdTe, etc., or IV—IV semiconductor compound layers, such as SiC, for example. Further, the LED devices may also include other layers such as cladding layers, wave guide layers and contact layers.

Currently semiconductor devices, such as LEDs, may be fabricated on a flexible base material such as polyimide to provide flexible device arrays that are conformal to a variety of different shapes for use in a variety of products. For instance, LED arrays may be fabricated on a flexible base material for use in lighting products such as round lamp bulbs, flood lights, cylindrical flashlights, etc. However, semiconductor devices such as GaN based LEDs, for example, are sensitive to electrostatic discharge, because they are fabricated on insulating sapphire substrates. As a result, there is no clear discharge path for electrostatic discharge other than through the LED. Electrostatic discharge through the LED may result in severe damage to the LED by degrading the p-n junction characteristics of the device. It is therefore advantageous to create an alternative path for electrostatic discharge.

One mechanism for minimizing the likelihood of electrostatic damage to the semiconductor devices, such as LEDs, is to incorporate a high value bleed resistor to provide a discharge path for charge dissipation. However, for semiconductor devices fabricated on flexible base materials, the fabrication of resistors may offer certain challenges. It is often difficult to fabricate small high value thin film resistors in the range of 100 kohms–1 Mohm on a flexible base material such as polyimide. Commonly used resistor films such as tantalum nitride ($TaN_2$), nickel chrome (NiCr), and chromium silicide (CrSi) have sheet resistance values in the range of 100–300 ohms/square. At these values, resistors in the range of 100 kohms–1 Mohm are generally patterned in serpentine structures which may cover very large areas. For semiconductor devices fabricated on a flexible base material, the large serpentine structures used to fabricate the highly resistive thin film resistors may be unfeasible. Further, processing on flexible based materials, such as polyimide films, generally require relatively low temperatures (<200° C.) such that the film maintains structural integrity. The lower temperatures required for processing on flexible base materials precludes the use of many of the materials that are typically used to fabricate high value resistors in semiconductor devices, since the materials require processing temperatures greater than 200° C.

BRIEF DESCRIPTION OF THE INVENTION

In accordance with one aspect of the present invention, there is provided a method of fabricating a resistor comprising the acts of activating a region on the surface of a flexible substrate, thereby forming an activated region, forming a resistive layer in the activated region, depositing one or more interconnect layers over at least a portion of the resistive layer, and patterning the one or more interconnect layers to form terminals of a resistor.

In accordance with another aspect of the present invention, there is provided a method of fabricating a resistor comprising the acts of activating the surface of a flexible substrate, thereby forming an activated layer, depositing a first metal layer over the surface of the activated layer, thereby causing a reaction in the activated layer that results in the formation of a resistive layer, depositing one or more interconnect layers over the first metal layer, etching each of the one or more interconnect layers and the first metal layer to the resistive layer, thereby forming terminals, and patterning the resistive layer to form a resistor coupled between the terminals.

In accordance with a further aspect of the present invention, there is provided a method of fabricating a resistor comprising the acts of depositing a masking layer over the surface of a flexible substrate, forming an opening in the masking layer, thereby exposing a portion of the flexible substrate through the opening, activating the exposed portion of the flexible substrate, thereby forming an activated region, removing the masking layer from the surface of the flexible substrate, depositing one or more interconnect layers over the surface of the flexible substrate, and patterning the one or more interconnect layers to form isolated terminals electrically coupled with respect to each other by the activated region.

In accordance with still another aspect of the present invention, there is provided a device comprising a flexible substrate, a resistive region formed on the flexible substrate and having a first end and a second end, and conductive terminals coupled to each of the first end and the second end.

In accordance with yet another aspect of the present invention, there is provided a device comprising a flexible substrate having a first side and a second side, a light emitting diode (LED) coupled to the first side of the flexible substrate and electrically coupled to contact regions on the second side of the flexible substrate, and a resistor formed on the second side of the flexible substrate, wherein the resistor is electrically coupled between each of the contact regions.

DETAILED DESCRIPTION OF SPECIFIC EMBODIMENTS

Figure 1:
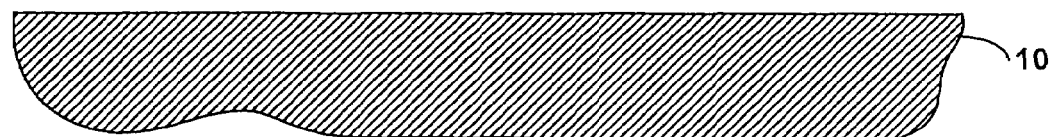
FIGS. 1–6A illustrate a cross-sectional view of a first exemplary technique for fabricating a resistor in accordance with the present invention.

A first exemplary technique for fabricating high value resistors (in the range of 100 kohms–1 Mohm) on a flexible base material will now be described with reference to FIGS. 1–6A. FIG. 1 illustrates a flexible substrate material 10 on which the resistor will be fabricated. The flexible substrate 10 has a thickness of 0.5 mils–3 mils and comprises a flexible plastic sheet that can be bent into a desired shape. A flexible substrate, capable of being bent or flexed, is defined as a film or composite with a modulus of elasticity not exceeding 10,000 PSI at 23 degrees C., tested by the Standard Flexure Stiffness method. The flexible substrate material 10 is an electrically insulating material and preferably comprises a polymer film upon which an electrically conductive material can adhere. The flexible substrate material 10 includes an elastic modulus and coefficients of thermal and humidity expansion which provide minimal dimensional change during processing. To maintain flexibility, the thickness of the flexible substrate material 10 may be minimized. However the substrate material 10 also has enough rigidity (due to either thickness or material composition) to support layers of metallization and maintain dimensional stability through all subsequent processing steps. The flexible substrate 10 generally comprises any one of a number of polyimide-based materials. For example, the flexible substrate 10 may comprise a Kapton® polyimide sheet that is provided as a roll by E.I. DuPont De Nemours & Co., an Apical® polyimide sheet provided by Kanegafuchi Chem. Indus. Co., or an Upilex® polyimide sheet provided by UBE Indus. Inc. While the present techniques are generally directed to fabricating resistors on flexible base materials, such as polyimide, the exemplary techniques described herein may also be implemented on a more rigid substrate having a polyimide-based top layer.

Initially, the flexible substrate 10 is placed in a vacuum chamber wherein a physical vapor deposition (PVD) technique may be implemented to activate the flexible substrate 10. By activating the surface of the flexible substrate 10, the surface is rendered more reactive such that carbon bonds can be more easily formed, as described further below. To implement the PVD process, the flexible substrate 10 is placed in a substrate carrier in the chamber and gas, such as argon (Ar), is introduced into the chamber. To reduce contamination within the chamber and to provide a cleaning effect at the surface of the flexible substrate 10, a small negative bias (charge) may be applied to the substrate carrier. Radio frequency (RF) sputtering may be used in conjunction with electrical biasing to advantageously etch and clean the exposed surface of the flexible substrate 10. Etching and cleaning are achieved by biasing the substrate carrier at a different field potential than the argon (Ar) gas which is introduced into the vacuum chamber and ionized to a positive charge, causing the argon atoms to impinge directly on the exposed surface of the flexible substrate 10. Removal of contamination from the surface of the flexible substrate 10 improves electrical contact between the exposed flexible substrate 10 regions and the materials later disposed thereon and improves adhesion to the surface of the flexible substrate 10.

Figure 2:
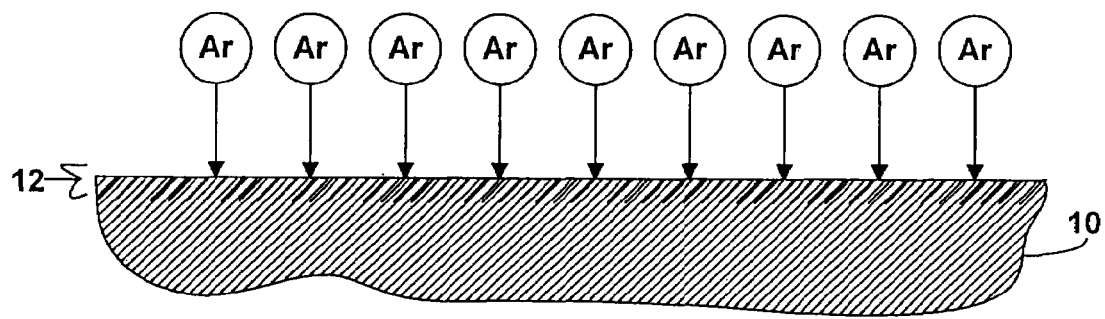

Aside from removing surface impurities, the ion bombardment of the argon (Ar) ions at the surface of the flexible substrate 10 also causes a preferential bond-breaking of imide carbonyl groups and results in the formation of graphite-like carbon, thus "activating" the surface of the flexible substrate 10 thereby making it receptive to the formation of carbide bonds with the introduction of an additional material. The bombardment of the Argon (Ar) ions onto the surface of the flexible substrate 10 is illustrated in FIG. 2. As previously described, the ion bombardment removes surface impurities and activates the surface of the flexible substrate 10. By activating the surface of the flexible substrate 10, an activated region 12 is formed on the surface of the flexible substrate 10. As described below, the activated region 12 may be used to form high value resistor structures by providing an active area that easily combines with other materials to form a highly resistive region.

Figure 3:
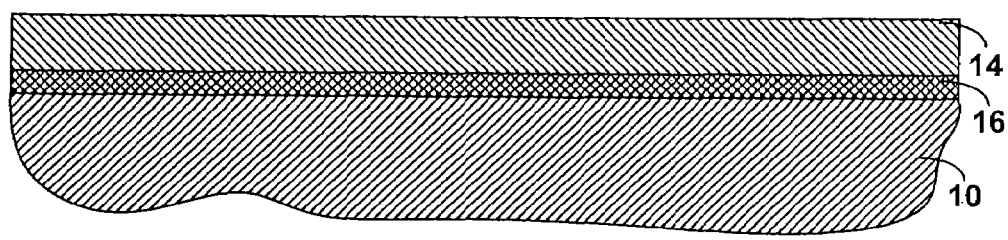

After the flexible substrate 10 is activated, a layer of titanium (Ti) 14 is deposited on the flexible substrate 10, as illustrated in FIG. 3. The Ti layer 14 may be disposed using a second type of PVD technique such as planar magnetron sputtering. As can be appreciated by those skilled in the art, magnetron sputtering may be implemented using a low chamber pressure and a chamber temperature of less than 200° C. which is advantageous for fabrication on polyimide-based materials, such as the flexible substrate 10. The Ti layer 14 may be disposed at a thickness of 300 angstroms–1000 angstroms, for example. A system such as an MRC 603 may be used to implement the magnetron sputtering. In one embodiment, the chamber may be set to a pressure of 6μ and operated at a power level of 800 W for 4 minutes to dispose the Ti layer 14.

As the Ti layer 14 is disposed onto the flexible substrate 10, the activated region 12 of the flexible substrate 10 reacts strongly with the titanium (Ti) and charge transfer occurs via the carbonyl groups of the activated region 12. As the Ti layer 14 coverage increases, a thin titanium carbide (Ti—C) layer 16 forms in the activated region 12 of the flexible substrate 10, as illustrated in FIG. 3. The Ti—C layer 16 is highly resistive (100 Kohms–1 Mohm) and can therefore be used to fabricate high value (100 Kohms–1 Mohm) resistors on the surface of the flexible substrate 10.

Figure 4:
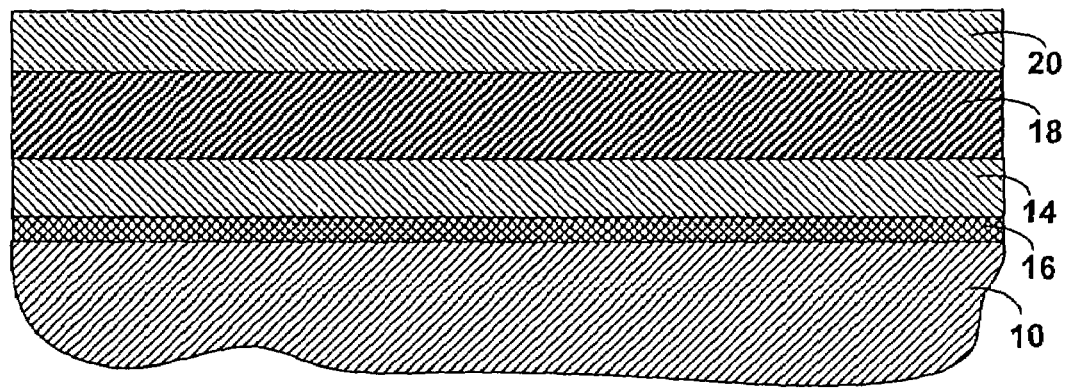

After the deposition of the Ti layer 14 and the formation of the Ti—C layer 16, interconnect materials may be deposited on the Ti layer 14 as illustrated in FIG. 4. A copper (Cu) seed layer 18 may be deposited on the Ti layer 14 by a physical vapor deposition (PVD) process, for example. The Cu seed layer 18 may be deposited at a thickness of 3000 angstroms, for example. Next, the Cu seed layer 18 may be electroplated. Finally, to complete the interconnect, a seed layer of titanium (Ti) 20 may be deposited over the Cu seed layer 18 by a PVD process, for example. The Ti seed layer 20 is optional and may be deposited at a thickness of 1000 angstroms, for example.

Next, the Ti—C layer 16 is patterned into a resistor element having a highly resistive region coupled between two terminals. In one process, a photoresist patterning technique may be implemented. First; a photoresist (not shown) may be applied over the Ti seed layer 20 and patterned to provide an opening 22 which may be etched in the interconnect layers to expose a region of the underlying Ti—C layer 16, as illustrated with respect to FIG. 5. As can be appreciated, a photoresist may be patterned such that a wet or dry etch process may be implemented to remove each of the layers of the interconnect in a desirable pattern. For instance, a wet chemical etch process using a hydrofluoric acid (HF) solution for Ti and a ferric chloride ($FeCl_3$) for Cu may be used to selectively remove the areas patterned by the photoresist. While removing the lower Ti layer 14 using the HF solution, the Ti—C layer 16 remains unetched. It should be understood that those skilled in the art readily understand the deposition, masking and etching techniques needed to construct the structure illustrated in FIG. 5. The interconnect layers may be etched such that the opening 22 exposes a portion of the underlying Ti—C layer 16.

Figure 5:
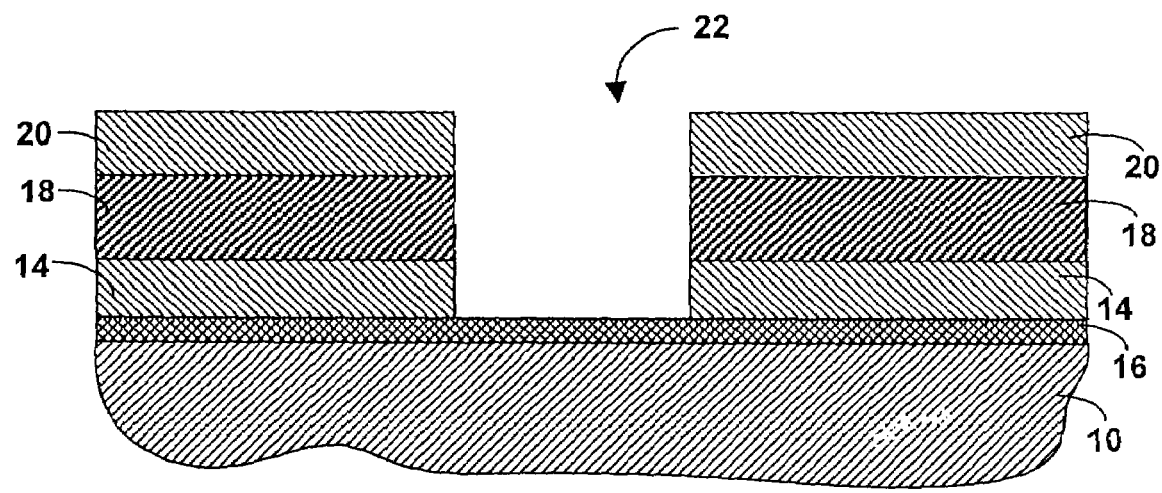
Figure 5A:
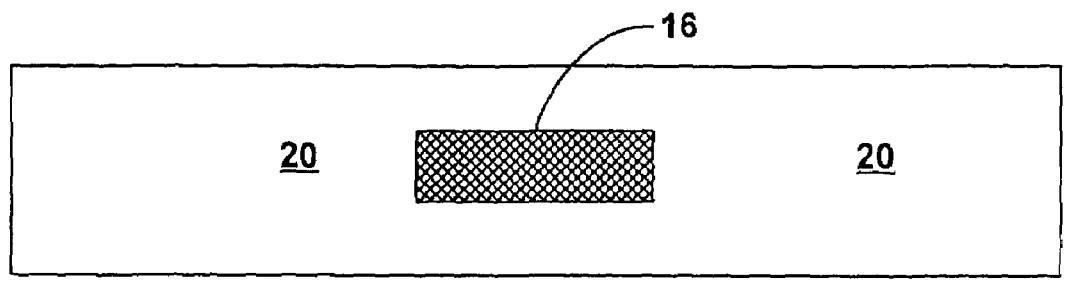

FIG. 5A illustrates a top view of the structure illustrated with respect to FIG. 5. As can be appreciated, the Ti—C layer 16 is exposed through the interconnect layers. The remainder of the surface remains covered with the interconnect layers. Accordingly, the top layer (Ti layer 20) is the only other material visible in the present view. The Ti—C layer 16 forms a resistor that may be coupled to an integrated circuit device by additional processing of the interconnect layers as further described with reference to FIGS. 6 and 6A.

Figure 6:
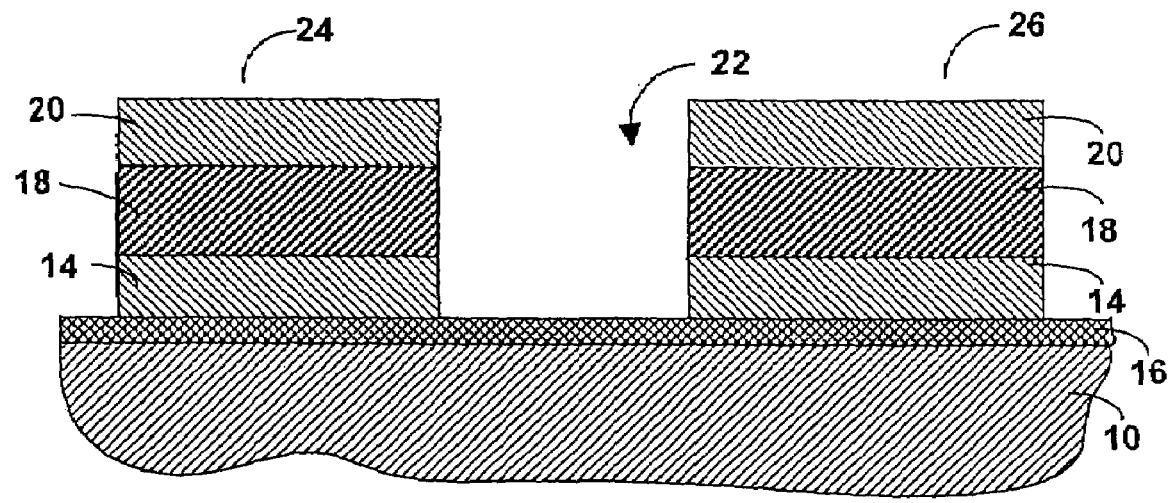
Figure 6A:
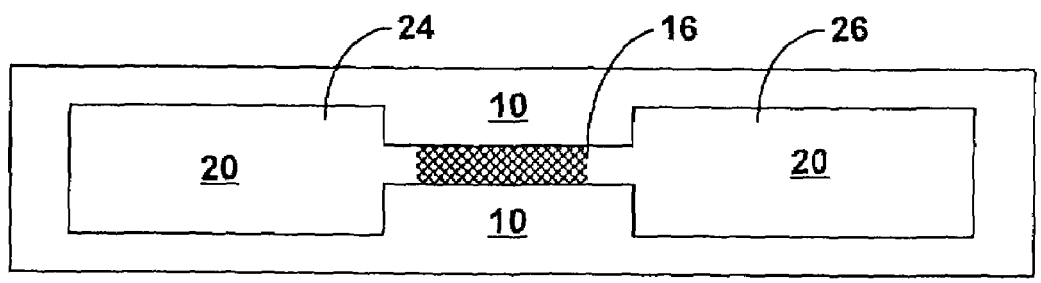

FIG. 6 illustrates the further fabrication of a resistor formed with the Ti—C layer 16. FIG. 6A illustrates a top view of the structure illustrated in FIG. 6. A photoresist may be used to further pattern the interconnect layers to provide isolated terminal regions 24 and 26. The terminal regions 24 and 26 are patterned to isolate the Ti—C layer 16 to form a high value resistor that may be electrically coupled to an integrated pattern device, such as an LED, via the terminal regions 24 and 26. Accordingly, the structure of the terminal regions 24 and 26 will vary depending on the application. In the present exemplary embodiment, a simple linear resistor has been patterned, as best illustrated in FIG. 6A.

A two-step etch process may be implemented to form the structure illustrated with reference to FIGS. 6 and 6A. First, a photoresist is patterned to form the desired structure of the terminal regions 24 and 26. As with the etch process described with reference to FIGS. 5 and 5A, the interconnect layers are etched to the surface of the Ti—C layer 16 by a chemical etchant, for example. It should be understood that those skilled in the art readily understand the deposition, masking and etching techniques needed to construct the structure illustrated in FIGS. 6 and 6A. While the present exemplary embodiment implements a first etch to pattern the structure illustrated with respect to FIGS. 5 and 5A, and a second etch to further pattern the structure as illustrated in FIGS. 6 and 6A, a single etch step may be implemented to etch the interconnect layers such that the underlying Ti—C layer 16 is exposed.

After the interconnect layers are removed, via a wet etch process, for example, the underlying Ti—C layer 16 may be etched using a dry etch process, such as a plasma etch. The dry plasma etch may be implemented using a $CF_4$ gas mixed with $O_2$, for example. The plasma etch will remove any areas of the resistive Ti—C layer 16 that are exposed to the gas/plasma. Accordingly, a photoresist mask may be applied over the exposed areas of the Ti—C layer 16 that are to be retained to form the resistor. In the present embodiment illustrated in FIGS. 6 and 6A, a thin strip of photoresist may be applied in the opening 22 and patterned to cover the narrow region of the Ti—C layer 16 illustrated in FIG. 6A. The plasma etch removes any exposed areas of the Ti—C layer 16. Areas of Ti—C not covered by the protective photoresist or the interconnect layers will be removed during the plasma etch. Accordingly, the areas around the terminal regions 24 and 26 are etched to expose the underlying flexible substrate 10. As illustrated in FIGS. 6 and 6A, the remaining structure forms a resistive region (the strip of Ti—C material 16) coupled between the terminal regions 24 and 26. FIG. 6A provides a top view of the final structure wherein the Ti seed layer 20 is viewable as the top layer of the interconnect and the remainder of the Ti—C layer 16 is coupled between the terminal regions 24 and 26 such that a resistor is formed on the surface of the flexible substrate 10. As previously described, the resistor may be patterned to form any desired shape.

FIGS. 7–12A illustrate an alternate exemplary technique for fabricating high value resistors (in the range of 100 kohms–1 Mohm). As will become evident, many of the fabrication steps and materials are the same as the steps and materials described above with reference to FIGS. 1–6A. To avoid repetition, some of the specific details have been omitted in the discussion below. However, the discussion of the exemplary technique described with reference to FIGS. 7–12A should be read in view of the more complete processing and material descriptions discussed above with reference to FIGS. 1–6A.

Figure 7:
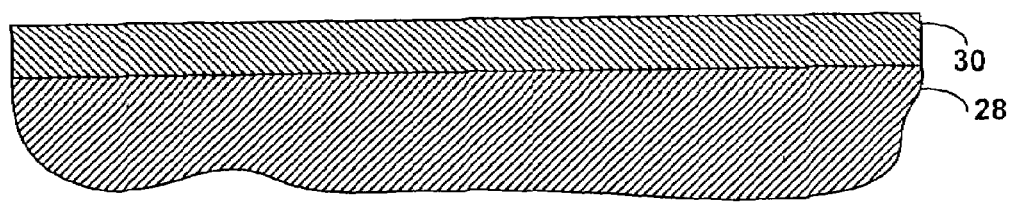
FIGS. 7–12A illustrate a cross-sectional view of a second exemplary technique for fabricating a resistor in accordance with the present invention.

Referring initially to FIG. 7, a flexible substrate 28 is illustrated. As previously discussed, the flexible substrate 28 generally comprises a polyimide-based material. Initially, a masking layer, such as a layer of titanium (Ti) 30, is deposited over the flexible substrate 28 by a physical vapor deposition (PVD) process, for example. In the present exemplary embodiment, the Ti layer 30 may be deposited at a thickness of 300 angstroms–1000 angstroms, for example. In the present exemplary embodiment, the Ti layer 30 will be used as an activation mask to control the area of the flexible substrate 28 that will be activated, as described further below.

Figure 8:
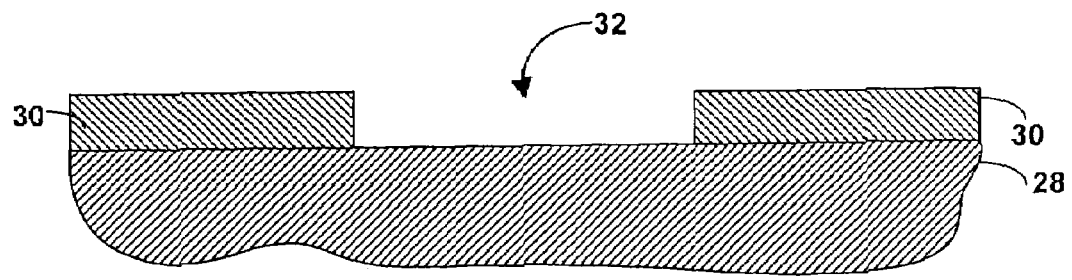
Figure 8A:
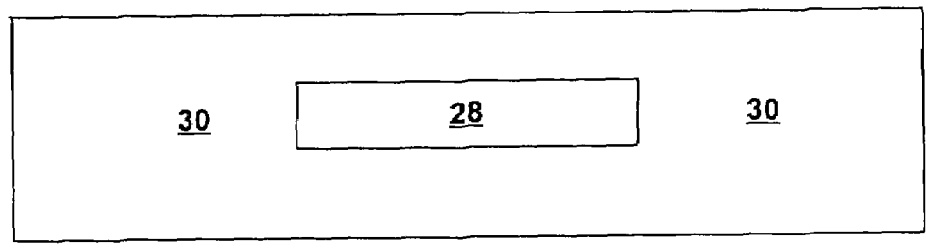

Referring to FIG. 8, an opening 32 is etched in the Ti layer 30. The Ti layer 30 may be patterned using a photoresist and photomask and then etched implementing a wet chemical etch process using a hydrofluoric acid (HF) solution, for example. The opening 32 is patterned to the desirable dimensions of the region that will be activated. Thus, the opening 32 provides a window to expose a portion of the flexible substrate 28. FIG. 8A is a top view of the structure illustrated in FIG. 8. As illustrated with reference to FIG. 8A, the surface of the flexible substrate 28 is completely covered by the Ti layer 30, with the exception of the area etched through the opening 32 (FIG. 8) to expose the underlying flexible substrate 28.

Figure 9:
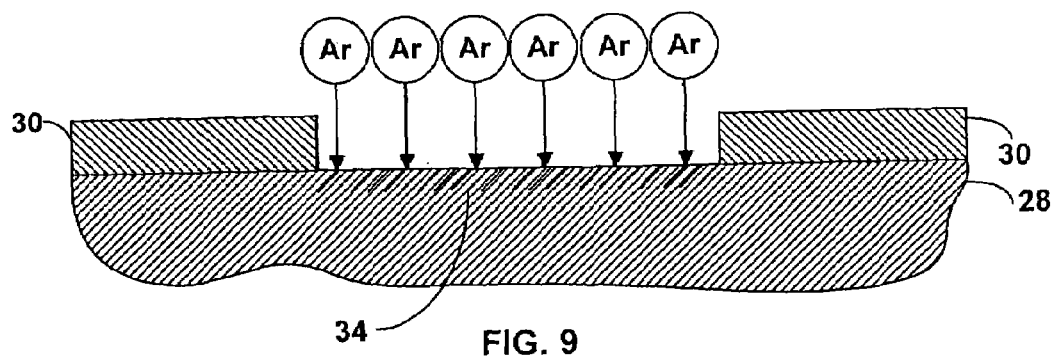

Next, the area of the flexible substrate 28 that is exposed through the opening 32 is subjected to high energy argon (Ar) ion bombardment to activate the exposed area of the flexible substrate 28, as illustrated in FIG. 9. As previously described, the argon (Ar) ion bombardment at the surface of the flexible substrate 28 causes a preferential bond-breaking of imide carbonyl groups and the formation of graphite-like carbon, thereby forming an activated region 34 of the flexible substrate 28 receptive to the formation of carbide bonds with the introduction of an additional material. The activated region 34 may be used to form high value resistor structures by providing an active area that easily combines with other materials to form a highly resistive region. As can be appreciated, the Ti layer 30 provides a mask for the planar magnetron sputtering (ion bombardment) process such that the only area of the flexible substrate 28 that is activated is the area not covered by the Ti layer 30 (i.e. the area exposed through the opening 32). By patterning the Ti layer 30 to provide a selective opening, the shape of the resistive area is already established, thereby eliminating the later step of forming the resistive geometry through plasma etching as described in the previous embodiment with respect to FIGS. 6 and 6A. Further, in the present exemplary embodiment, the Ti layer 30 is implemented to provide a masking layer. Titatium is used to avoid contamination in the magnetron sputtering chamber. However, other materials may be used to provide a masking layer.

Figure 10:
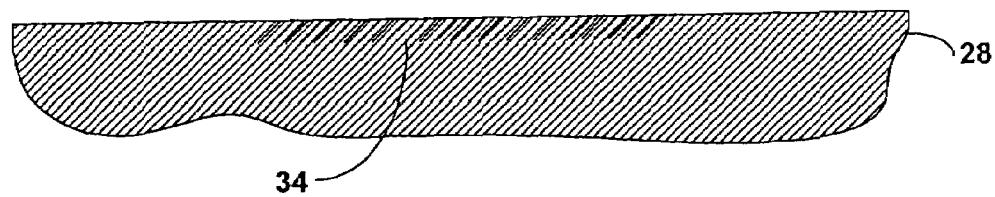

After formation of the activated region 34, the masking layer (Ti layer 30) is completely removed, as illustrated in FIG. 10. The Ti layer 30 may be etched implementing a wet chemical etch process using a hydrofluoric acid (HF) solution, for example. Thus, the remaining structure includes the flexible substrate 28 having a patterned activated region 34.

Figure 11:
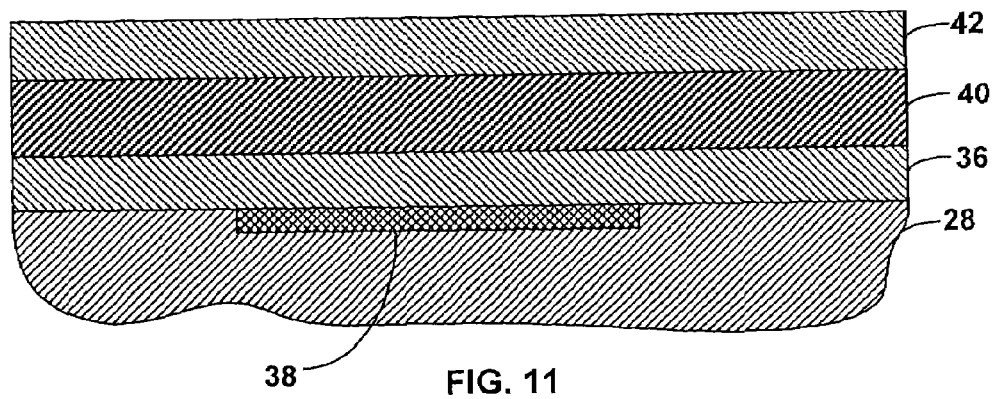

Next, interconnect layers are disposed on the surface of the flexible substrate 28, as illustrated in FIG. 11. First, a layer of titanium (Ti) 36 is deposited using a PVD technique, such as planar magnetron sputtering. The Ti layer 36 may be disposed at a thickness of 300 angstroms–1000 angstroms, for example. As the Ti layer 36 is disposed onto the flexible substrate 28, the activated region 34 reacts strongly with the titanium (Ti) and charge transfer occurs via the carbonyl groups of the activated region 34. As the Ti layer 36 coverage increases, a thin titanium carbide (Ti—C) layer 38 forms in the activated region 34, as illustrated in FIG. 3. As previously described, the Ti—C layer 38 is highly resistive and can therefore be used to fabricate high value (100 Kohms–1 Mohm) resistors on the surface of the flexible substrate 38.

After the deposition of the Ti layer 36 and the formation of the Ti—C layer 38, additional interconnect materials may be disposed over the Ti layer 36, as further illustrated in FIG. 11. A copper (Cu) seed layer 40 may be deposited on the Ti layer 36 using physical vapor deposition (PVD), for example. The Cu seed layer 40 may be disposed at a thickness of 3000 angstroms, for example. Next, the Cu seed layer 40 may be electroplated. Finally, to complete the interconnect, a seed layer of titanium (Ti) 42 may be disposed over the Cu seed layer 40 by a PVD process, for example. The Ti seed layer 42 is optional and may be disposed at a thickness of 1000 angstroms, for example.

Figure 12:
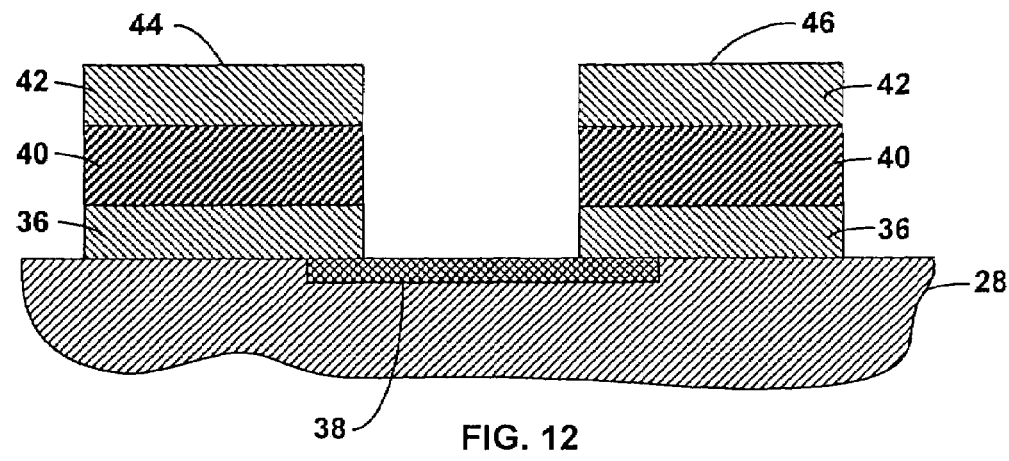
Figure 12A:
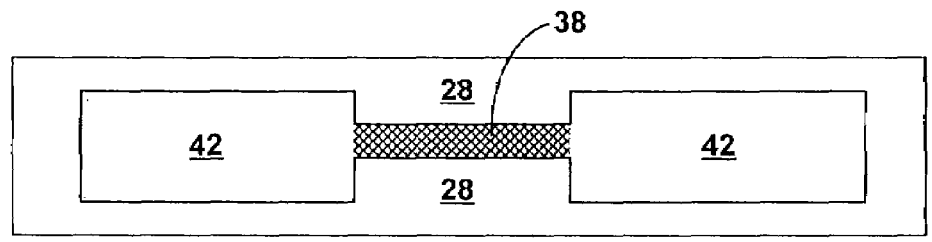

Because the Ti—C layer 38 is already patterned into a useful resistor, the only remaining step is to form the terminal regions by patterning the interconnect layers into a desirable pattern. FIG. 12 illustrates the formation of the terminal regions 44 and 46. FIG. 12A illustrates a top view of the structure illustrated in FIG. 12. A photoresist may be used to pattern the interconnect layers to provide isolated terminal regions 44 and 46. After the photoresist is patterned, the interconnect layers are etched to the surface of the flexible substrate 28 by a chemical etchant, for example. As previously described, the terminal regions 44 and 46 are patterned to isolate the Ti—C layer 38 to form a high value resistor that may be electrically coupled to an integrated circuit device, such as an LED, via the terminal regions 44 and 46. Accordingly, the structure of the terminal regions 44 and 46 will vary depending on the application. In the present exemplary embodiment, a simple linear resistor has been patterned, as best illustrated in FIG. 12A. It should be understood that those skilled in the art readily understand the deposition, masking and etching techniques needed to construct the structure illustrated in FIGS. 12 and 12A.

As previously described, the exemplary high value resistors fabricated on the flexible substrates in accordance with the present techniques may be used in a number of applications. For instance, the resistors may be formed on the backside of a flexible substrate to provide high value bleed resistors to prevent damage to light emitting diodes (LEDs) from electrostatic discharge. Accordingly, FIGS. 13 and 14 illustrate an exemplary implementation of the present techniques.

Figure 13:
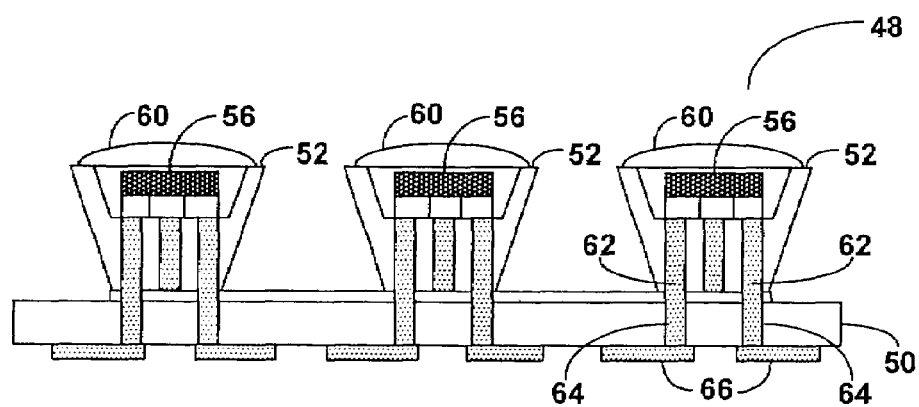
FIG. 13 illustrates a cross-sectional view of an exemplary light emitting diode (LED) die array.
Figure 14:
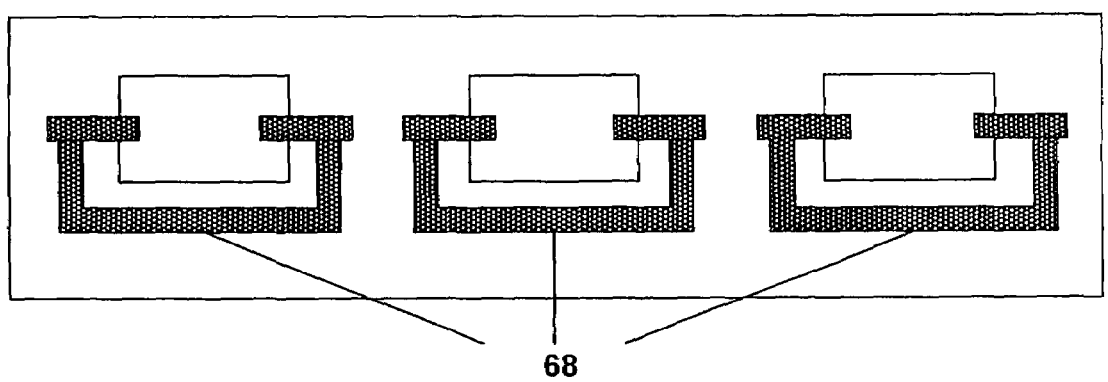
FIG. 14 illustrates a backside view of the LED die array illustrated in FIG. 14 incorporating the resistors fabricated in accordance with the present techniques.

Referring initially to FIG. 13, a cross section of an exemplary LED array 48 formed on a flexible substrate 50 is illustrated. The specific embodiment of the LED array 48 and method for fabricating the array is not critical to the present application, other than the fact that the array is fabricated on a flexible substrate 50. Accordingly, the following description of the LED array 48 is not believed to limit the presently disclosed structures in any way and is only meant to provide an exemplary use of the resistive structures described herein.

As previously described, the flexible substrate 50 generally comprises a polyimide-based material such as Kapton®. Rigid carriers 52 may be attached to the flexible substrate 50 using an adhesive layer 54. The rigid carriers 52 may comprise a ceramic material, a moldable plastic or a polymer material, for example. The adhesive layer 54 may comprise an anisotropic conductive adhesive, for example. Each rigid carrier 52 includes a LED chip 56. The LED chip 56 may be surrounded with an encapsulating material 58, such as an epoxy, glass-filled epoxy or a polymer material, such as silicone, for example. Each LED structure further includes a lens structure 60 which may comprise any suitable material that is transparent to LED radiation, such as a polycarbonate layer. The lens structure 60 improves the light output of the LED chips 56.

Each rigid carrier 52 also includes a plurality of feedthrough conductive elements, such as electrodes 62 that are used to electrically couple the LED chips 56 to the underside of the rigid carriers 52. The electrodes 62 are coupled to the anisotropic conductive adhesive layer 54. Conductive interconnect paths 64 provide an electrically conductive path through the flexible substrate 50. As can be appreciated, the conductive interconnect paths 64 may comprise vias filled with a conductive material. The interconnect paths 64 are electrically coupled to interconnect layers 66 on the underside of the flexible substrate 50. Thus, a conductive path exists from the LED chip 56 to the electrodes 62, through the anisotropic conductive adhesive layer 54, through the interconnect paths 64 and to the interconnect layers 66 on the underside of the flexible substrate 50. These interconnect layers 66 may form the terminals of a resistor structure fabricated in accordance with the techniques described herein.

FIG. 14 illustrates a backside view of the flexible substrate 50 with bleed resistors 68 fabricated thereon, in accordance with the techniques described herein. As can be appreciated, the resistor 68 advantageously provides an electrical path for the discharge of electricity. The resistors 68 and terminal regions may be fabricated into the exemplary pattern illustrated in FIG. 14. After the resistors 68 are patterned and fabricated onto the flexible substrate 50, the LED array 48 may be formed and electrically coupled to the resistors 68 to provide protection of the LED chips 56 from damage due to electrostatic discharge, as previously described.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. For example, while reference is made herein to resistors formed in conjunction with semiconductor LEDs, the present techniques are equally applicable for use with other LED types, such as organic LEDs. Similarly, the resistors offered by the present advancement may find uses in any number of electrical and electronic circuitry within and beyond the lighting field.

What is claimed is:

1. A device comprising:
   a flexible substrate;
   a resistive region formed on the flexible substrate and having a first end and a second end, wherein the resistive region is formed in an activated region of the flexible substrate via a reaction between the activated region and a metal disposed on the activated region; and
   conductive terminals coupled to each of the first end and the second end.

2. The device, as set forth in claim 1, wherein the flexible substrate comprises a polyimide material.

3. The device, as set forth in claim 1, wherein the resistive region has a resistance in the range of 300 kohms–1 Mohm.

4. The device, as set forth in claim 1, wherein the resistive region comprises a titanium-carbide.

5. The device, as set forth in claim 1, wherein the resistive region is formed at a temperature of less than 200° C.

6. The device, as set forth in claim 1, wherein the resistive region does not comprise a serpentine structure.

7. The device, as set forth in claim 1, wherein each of the conductive terminals comprises a first layer of titanium.

8. The device, as set forth in claim 7, wherein each of the conductive terminals comprises a layer of copper.

9. The device, as set forth in claim 8, wherein each of the conductive terminals comprise a second layer of titanium disposed on the layer of copper.

10. The device, as set forth in claim 1, comprising a light emitting diode (LED) electrically coupled to each of the conductive terminals.

11. A device comprising:
    a flexible substrate having a first side and a second side;
    a light emitting diode (LED) coupled to the first side of the flexible substrate and electrically coupled to contact regions on the second side of the flexible substrate; and
    a resistor formed on the second side of the flexible substrate, wherein the resistor is electrically coupled between each of the contact regions.

12. The device, as set forth in claim 11, wherein the flexible substrate comprises a polyimide material.

13. The device, as set forth in claim 11, wherein the resistor has a resistance in the range of 300 kohms–1 Mohm.

14. The device, as set forth in claim 11, wherein the resistor comprises a titanium-carbide region.

15. The device, as set forth in claim 11, wherein the resistor is formed at a temperature of less than 200° C.

16. The device, as set forth in claim 11, wherein the resistor does not comprise a serpentine structure.

17. The device, as set forth in claim 11, wherein the resistor is formed in an activated region on the second side of the flexible substrate via a reaction between the activated region and a metal disposed on the activated region.

18. The device, as set forth in claim 17, wherein the resistor comprises a metal-carbide region coupled between each of a first interconnect region and a second interconnect region.

19. The device, as set forth in claim 18, wherein each of the first and second interconnect regions comprises a first layer of titanium.

20. The device, as set forth in claim 19, wherein each of the first and second interconnect regions comprises a layer of copper.

21. The device, as set forth in claim 20, wherein each of the first and second interconnect regions comprise a second layer of titanium deposited on the layer of copper.

* * * * *